(12) United States Patent
Liu

(10) Patent No.: US 10,411,206 B2
(45) Date of Patent: Sep. 10, 2019

(54) FLEXIBLE ARRAY SUBSTRATE AND METHOD FOR MANUFACTURING SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xiang Liu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/743,281

(22) PCT Filed: Nov. 30, 2017

(86) PCT No.: PCT/CN2017/113697
§ 371 (c)(1),
(2) Date: Jan. 10, 2018

(87) PCT Pub. No.: WO2019/100427
PCT Pub. Date: May 31, 2019

(65) Prior Publication Data
US 2019/0157584 A1   May 23, 2019

(30) Foreign Application Priority Data

Nov. 22, 2017 (CN) .......................... 2017 1 1173799

(51) Int. Cl.
*H01L 51/00* (2006.01)
*H01L 29/51* (2006.01)
(Continued)

(52) U.S. Cl.
CPC ........ *H01L 51/0097* (2013.01); *G02F 1/1362* (2013.01); *G02F 1/133305* (2013.01);
(Continued)

(58) Field of Classification Search
CPC ....... H01L 51/00; H01L 29/51; H01L 29/786; H01L 21/77; H01L 27/32; H01L 51/56;
(Continued)

(56) References Cited

U.S. PATENT DOCUMENTS 9,165,946 B1 * 10/2015 Chang ............... G02F 1/134363
2014/0022480 A1 * 1/2014 Yokoyama ........ H01L 29/42356
349/43
(Continued)

*Primary Examiner* — Alexander O Williams
(74) *Attorney, Agent, or Firm* — Soroker Agmon Nordman

(57) ABSTRACT

A flexible array substrate includes a substrate, a gate electrode and a scan line disposed on the substrate, and a first insulation layer disposed on the gate electrode and the scan line. The array substrate further includes an electrically conductive channel disposed on the first insulation layer; a source electrode; a drain electrode; and a data line disposed on the electrically conductive channel; a second insulation layer disposed on the source electrode; the drain electrode; and the data line; and a pixel electrode disposed on the second insulation layer.

18 Claims, 6 Drawing Sheets

(51) Int. Cl.
*H01L 29/786* (2006.01)
*H01L 21/77* (2017.01)
*H01L 27/32* (2006.01)
*G02F 1/1362* (2006.01)
*H01L 51/56* (2006.01)
*H01L 51/52* (2006.01)
*G02F 1/1333* (2006.01)
*H01L 27/12* (2006.01)

(52) U.S. Cl.
CPC .......... *H01L 21/77* (2013.01); *H01L 27/1218* (2013.01); *H01L 27/3244* (2013.01); *H01L 29/51* (2013.01); *H01L 29/78603* (2013.01); *H01L 51/003* (2013.01); *H01L 51/5253* (2013.01); *H01L 51/56* (2013.01)

(58) Field of Classification Search
CPC ....... H01L 51/52; H01L 27/12; G02F 1/1368; G02F 1/1362
USPC .......................................................... 257/88
See application file for complete search history.

(56) References Cited

U.S. PATENT DOCUMENTS

| | | | |
|---|---|---|---|
| 2016/0233235 A1* | 8/2016 | Miyairi | H01L 27/1225 |
| 2016/0260835 A1* | 9/2016 | Yamazaki | H01L 29/7869 |
| 2016/0284858 A1* | 9/2016 | Yamazaki | H01L 29/42392 |
| 2018/0204884 A1* | 7/2018 | Isa | H05B 33/02 |
| 2019/0027501 A1* | 1/2019 | Miyairi | H01L 29/7869 |

* cited by examiner

FLEXIBLE ARRAY SUBSTRATE AND METHOD FOR MANUFACTURING SAME

FIELD OF DISCLOSURE

The present disclosure relates to the field of display technology, and more particularly to a flexible array substrate and a method for manufacturing same.

BACKGROUND

Among various types of flat panels, thin film transistor liquid crystal displays (TFT-LCDs) have outstanding properties, including having small volume, low power consumption, and being radiation-free. Thus, TFT-LCDs dominate the commercial market of displays. Typically, a TFT-LCD includes a backlight source, an upper polarizer and a lower polarizer, a liquid crystal cell, a driving and control integrated circuit, etc., in which the liquid crystal cell is the essential core part of the display. The liquid crystal cell is generally formed by assembling an array substrate with a color filter substrate, and filling the space enclosed by the two substrates with liquid crystals.

However, as development of TFT-LCDs keeps moving, size of TFT-LCDs continuously increases and resolution of TFT-LCDs also increases, resulting in serious deterioration of image signal delay. Image signal delay is mainly determined by the equation T=RC, wherein R is signal resistance, and C is capacitance. R is generally related to materials used for forming electrical wires of the array such as gate electrodes, scan lines, and data lines. Gate electrodes, scan lines, and data lines of the array substrate are usually formed from a metallic material which is chemically stable and has high resistivity. Owing to fast development of TFT-LCDs, size of TFT-LCDs is increasing and the resolution of the TFT-LCDs is higher than before. This leads to serious deterioration of image signal delay. Moreover, since users are getting increasingly unsatisfied with display technology, manufacturers focus on developing flexible and transparent display apparatuses. But, the materials used for forming electrical wires of the array such as gate electrodes, scan lines, and data lines are non-transparent, and properties of such materials would be worsened when the displays are bent. Conventional displays cannot further meet the demand which requires that the displays are transparent and flexible.

Therefore, to solve the problems existing in conventional displays, there is a need to provide a method for manufacturing a flexible array substrate.

SUMMARY OF DISCLOSURE

The objective of the present disclosure is to provide a method for manufacturing a flexible array substrate. The present disclosure reduces image signal delay, enhances display quality, and enables the array substrate to have excellent light transparency and flexibility.

In a first aspect, the present disclosure provides a method for manufacturing a flexible array substrate, comprising:
 providing a substrate;
 forming a first graphene layer on the substrate, and patterning the first graphene layer to form a gate electrode and a scan line;
 forming a first insulation layer on the substrate, the gate electrode, and the scan line;
 forming a metal-oxide-semiconductor layer on the first insulation layer, and patterning the metal-oxide-semiconductor layer to form an electrically conductive channel;
 forming a second graphene layer on the electrically conductive channel and the first insulation layer, and patterning the second graphene layer to form a source electrode, a drain electrode, and a data line, wherein the electrically conductive channel is connected to the source electrode and the drain electrode;
 forming a second insulation layer on the substrate, the source electrode, the drain electrode, and the data line; and
 forming a carbon nanotube layer on the second insulation layer, and patterning the carbon nanotube layer to form a pixel electrode; wherein the pixel electrode is electrically connected to the drain electrode via a through-hole;
 wherein the substrate is a transparent glass substrate or a plastic substrate; and
 wherein the first insulation layer includes a third insulation layer and a fourth insulation layer disposed on the third insulation layer; and the third insulation layer is made of an organic resin, and the fourth insulation layer is made of oxide, nitride, or oxynitride.

In accordance with the method for manufacturing the flexible array substrate of the present disclosure, the metal-oxide-semiconductor layer has a thickness ranging from 50 to 2000 angstroms.

In accordance with the method for manufacturing the flexible array substrate of the present disclosure, the second insulation layer is made of an organic resin.

In accordance with the method for manufacturing the flexible array substrate of the present disclosure, the second insulation layer has a thickness ranging from 4000 to 30000 angstroms.

In accordance with the method for manufacturing the flexible array substrate of the present disclosure, the metal-oxide-semiconductor layer is made of amorphous indium-gallium-zinc oxide.

In accordance with the method for manufacturing the flexible array substrate of the present disclosure, the first graphene layer and the second graphene layer are formed by using a chemical vapor deposition process or a spin coating process.

In a second aspect, the present disclosure provides a method for manufacturing a flexible array substrate, comprising:
 providing a substrate;
 forming a first graphene layer on the substrate, and patterning the first graphene layer to form a gate electrode and a scan line;
 forming a first insulation layer on the substrate, the gate electrode, and the scan line;
 forming a metal-oxide-semiconductor layer on the first insulation layer, and patterning the metal-oxide-semiconductor layer to form an electrically conductive channel;
 forming a second graphene layer on the electrically conductive channel and the first insulation layer, and patterning the second graphene layer to form a source electrode, a drain electrode, and a data line, wherein the electrically conductive channel is connected to the source electrode and the drain electrode;
 forming a second insulation layer on the substrate, the source electrode, the drain electrode, and the data line; and
 forming a carbon nanotube layer on the second insulation layer, and patterning the carbon nanotube layer to form a pixel electrode, wherein the pixel electrode is electrically connected to the drain electrode via a through-hole.

In accordance with the method for manufacturing the flexible array substrate of the present disclosure, the substrate is a transparent glass substrate or a plastic substrate.

In accordance with the method for manufacturing the flexible array substrate of the present disclosure, the first insulation layer includes a third insulation layer and a fourth insulation layer disposed on the third insulation layer; and the third insulation layer is made of an organic resin, and the fourth insulation layer is made of oxide, nitride, or oxynitride.

In accordance with the method for manufacturing the flexible array substrate of the present disclosure, the metal-oxide-semiconductor layer has a thickness ranging from 50 to 2000 angstroms.

In accordance with the method for manufacturing the flexible array substrate of the present disclosure, the second insulation layer is made of an organic resin.

In accordance with the method for manufacturing the flexible array substrate of the present disclosure, the second insulation layer has a thickness ranging from 4000 to 30000 angstroms.

In accordance with the method for manufacturing the flexible array substrate of the present disclosure, the metal-oxide-semiconductor layer is made of amorphous indium-gallium-zinc oxide.

In accordance with the method for manufacturing the flexible array substrate of the present disclosure, the first graphene layer and the second graphene layer are formed by using a chemical vapor deposition process or a spin coating process.

In a third aspect, the present disclosure provides a flexible array substrate, comprising:
- a substrate;
- a gate electrode and a scan line disposed on the substrate;
- a first insulation layer disposed on the gate electrode and the scan line;
- an electrically conductive channel disposed on the first insulation layer;
- a source electrode, a drain electrode, and a data line disposed on the electrically conductive channel;
- a second insulation layer disposed on the source electrode, the drain electrode, and the data line; and
- a pixel electrode disposed on the second insulation layer; wherein the electrically conductive channel is connected to the source electrode and the drain electrode, and the pixel electrode is electrically connected to the drain electrode via a through-hole;
- wherein the gate line and the scan line are formed from a patterned first graphene layer; the electrically conductive channel is formed from a patterned metal-oxide-semiconductor layer; the source electrode, the drain electrode, and the data line are formed from a patterned second graphene layer; and the pixel electrode is formed from a patterned carbon nanotube layer.

In accordance with the flexible array substrate of the present disclosure, the substrate is a transparent glass substrate or a plastic substrate.

In accordance with the flexible array substrate of the present disclosure, the first insulation layer includes a third insulation layer and a fourth insulation layer disposed on the third insulation layer; and the third insulation layer is made of an organic resin, and the fourth insulation layer is made of oxide, nitride, or oxynitride.

In accordance with the flexible array substrate of the present disclosure, the metal-oxide-semiconductor layer has a thickness ranging from 50 to 2000 angstroms.

In accordance with the flexible array substrate of the present disclosure, the second insulation layer is made of an organic resin.

In accordance with the flexible array substrate of the present disclosure, the second insulation layer has a thickness ranging from 4000 to 30000 angstroms.

The present disclosure provides a flexible array substrate and a method for manufacturing same. According to the present disclosure, graphene is utilized to form the gate electrode, the scan line, the source electrode, the drain electrode, and the data line, which not only reduces image signal delay but enhances display quality. In addition, a metal-oxide-semiconductor material is further utilized to form the electrically conducive channel, enabling the array substrate to have excellent light transparency and flexibility.

To make the present disclosure as described above be easily understood, some preferred embodiments are provided below for specifically explaining the content of the same.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
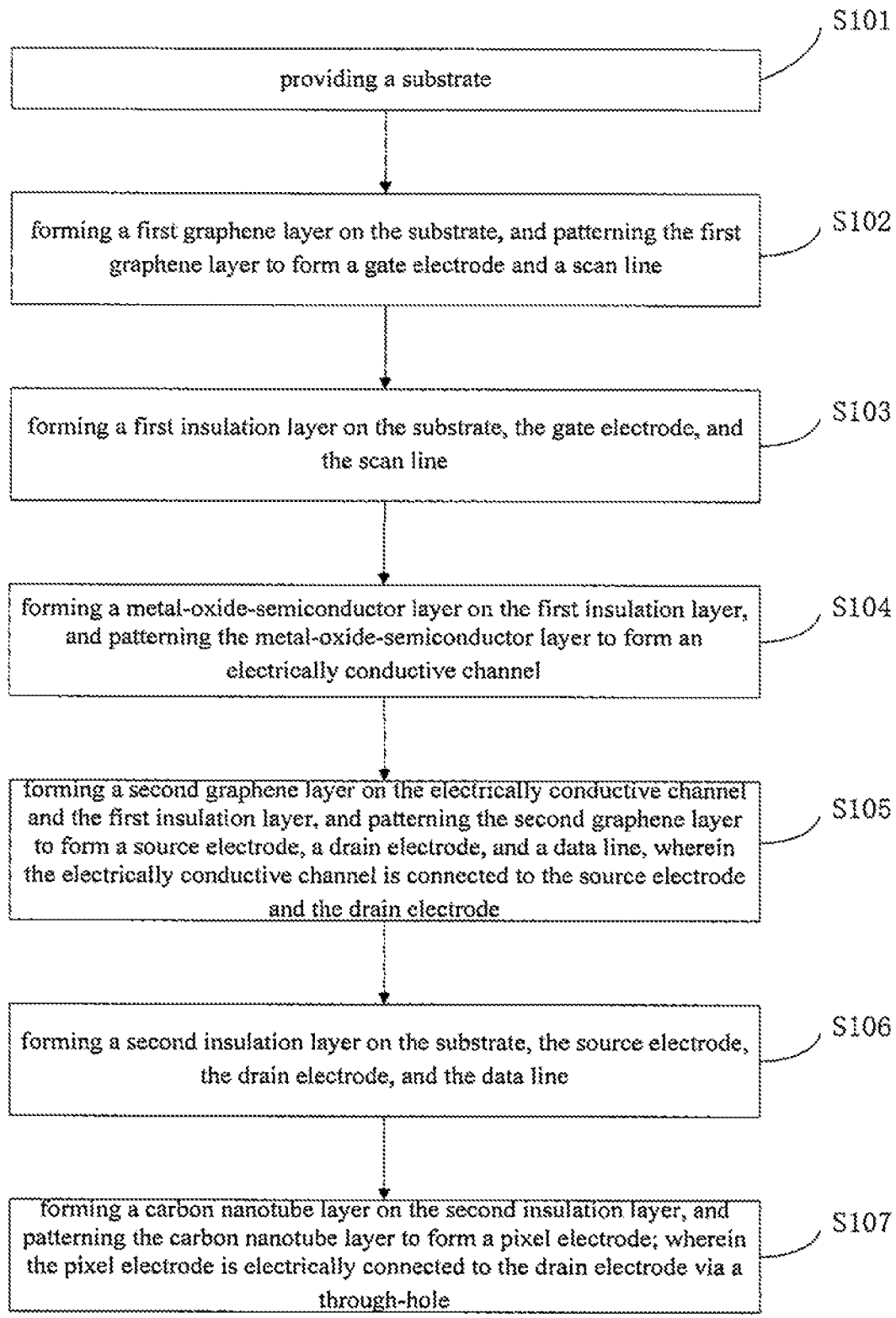
FIG. 1 is a flowchart showing a method for manufacturing a flexible array substrate according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The following description provides in detail an explanation of materials, including graphene and metal-oxide-semiconductor, which are used in a method for manufacturing a flexible array substrate according to the present disclosure.

Graphene has $sp^2$ hybrid orbitals and is composed of hexagonal honeycomb lattices. Graphene is used for manufacturing a flexible array substrate according to the present disclosure, and is formed as a 2-dimensional planar film having a thickness of single carbon atom. Graphene is currently the thinnest and hardest material in the world, and is nearly totally transparent. For example, a single layer of graphene having a thickness of 0.34 nanometers absorbs only 2.3% of light passing therethrough. In addition, thermal conductivity of graphene is as high as 5300 W/m·K, higher than that of carbon nanotubes and diamonds. Its electron mobility at room temperature exceeds 15000 $cm^2/(V·s)$ that is higher than that of carbon nanotube or crystalline silicone. Nevertheless, resistivity thereof is as low as about 6-10 Ω·cm, lower than copper or silver. Graphene is currently the material having the lowest resistivity in the world. Therefore, graphene used as a transparent and flexible conductor can meet requirements of TFT-LCDs having large sizes. In a method for manufacturing a flexible array substrate according to the present disclosure, graphene is utilized to form a gate electrode, a scan line, a source electrode, a drain electrode, and a data line, which not only reduces image signal delay occurring in the gate electrode, the scan line, the source electrode, the drain electrode, and the data line, but enhances display quality and enables the display to have excellent light transparency and flexibility.

Moreover, in the method for manufacturing a flexible array substrate according to the present disclosure, a metal-oxide-semiconductor material is further utilized to form an electrically conducive channel. The metal-oxide-semiconductor material can be made of amorphous indium-gallium-zinc oxide, which has high carrier mobility, so that the charge/discharge rate of thin film transistors toward pixel electrodes can be increased and the response time of pixels can be shortened. Furthermore, the metal-oxide-semiconductor film has excellent uniformity. Use of metal-oxide-semiconductor material can make TFT-LCDs be manufactured in large sizes and be flexible.

The following description involves a method for manufacturing a flexible array substrate according to the present disclosure. Referring to FIG. 1, FIG. 1 is a flowchart showing a method for manufacturing a flexible array substrate according to one preferred embodiment of the present disclosure. The method for manufacturing a flexible array substrate according to one preferred embodiment of the present disclosure includes:

a step S101 of providing a substrate;
a step S102 of forming a first graphene layer on the substrate, and patterning the first graphene layer to form a gate electrode and a scan line;
a step S103 of forming a first insulation layer on the substrate, the gate electrode, and the scan line;
a step S104 of forming a metal-oxide-semiconductor layer on the first insulation layer, and patterning the metal-oxide-semiconductor layer to form an electrically conductive channel;
a step S105 of forming a second graphene layer on the electrically conductive channel and the first insulation layer, and patterning the second graphene layer to form a source electrode, a drain electrode, and a data line, wherein the electrically conductive channel is connected to the source electrode and the drain electrode;
a step S106 of forming a second insulation layer on the substrate, the source electrode, the drain electrode, and the data line; and
a step S107 of forming a carbon nanotube layer on the second insulation layer, and patterning the carbon nanotube layer to form a pixel electrode; wherein the pixel electrode is electrically connected to the drain electrode via a through-hole.

This preferred embodiment of the present disclosure will be specifically explained with reference to FIGS. 2A-2L. FIGS. 2A-2L show each step in the process flow of the method for manufacturing a flexible array substrate according to this preferred embodiment of the present disclosure.

Figure 2A:
FIGS. 2A-2L show each step in a process flow of a method for manufacturing a flexible array substrate according to one preferred embodiment of the present disclosure.

In the step S101, as shown in FIG. 2A, a substrate 201 is provided. Preferably, the substrate 201 can be either a transparent glass substrate or a plastic substrate. In the case that it is a transparent glass substrate, it is required that the transparent glass substrate has a thickness less than 0.1 millimeter. In the case that, it is a plastic substrate, the plastic substrate could be made of polyimide.

Figure 2B:
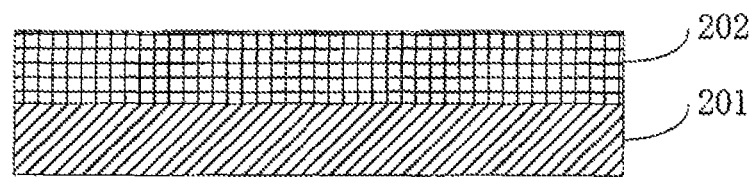
Figure 2C:
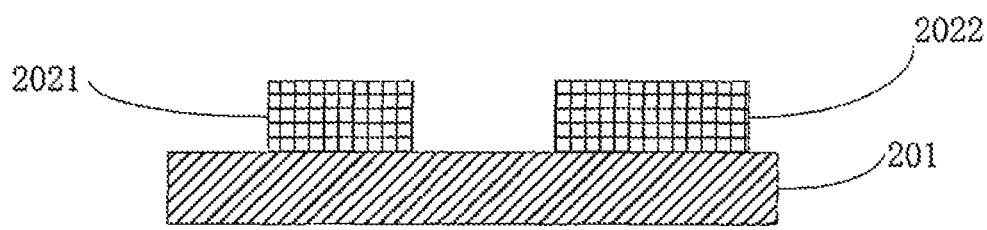

In the step S102, as shown in FIG. 2B, a first graphene layer 202 is deposited on the substrate 201. The first graphene layer 202 can be formed on the substrate 201 first by using a chemical vapor deposition process or a spin coating process. Then, as shown in FIG. 2C, the first graphene layer is patterned to form a pattern which includes a gate electrode 2021 and a scan line 2022.

In the step S103, a first insulation layer 203 is formed on the first graphene layer 202. The first insulation layer 203 is functioned to isolate the first graphene layer 202. Preferably, the first insulation layer 203 includes a third insulation layer 2031 and a fourth insulation layer 2032 disposed on the third insulation layer 2031. The third insulation layer 2031 is made of an organic resin, and the fourth insulation layer 2032 is made of oxide, nitride, or oxynitride.

Figure 2D:
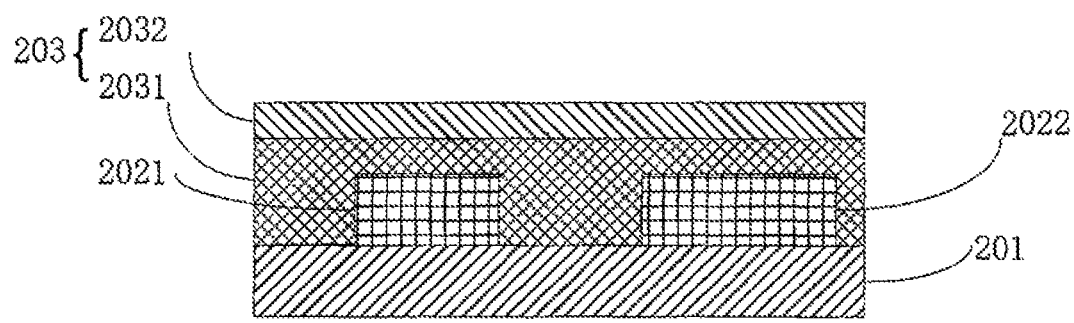

Specifically, as shown in FIG. 2D, a third insulation layer 2031 is formed on the first graphene layer 202 first by using a spin coating process. Thereafter, a fourth insulation layer 2032 is formed on the third insulation layer 2031 by using a chemical vapor deposition process. The fourth insulation layer 2032 has a thickness ranging from 100 to 1000 angstroms.

Figure 2E:
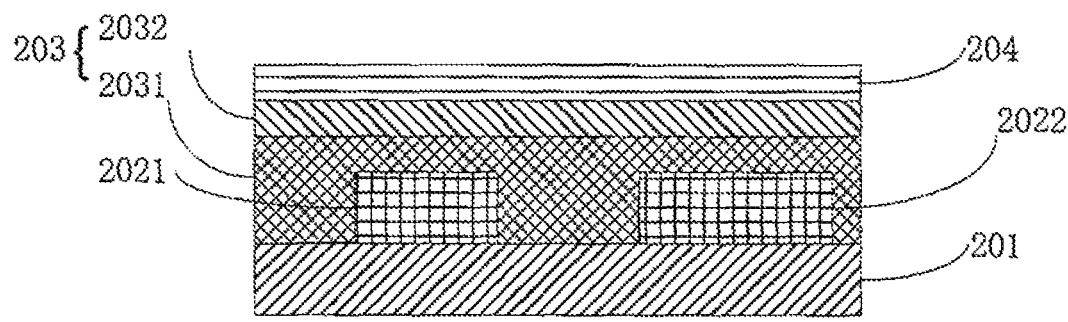
Figure 2F:
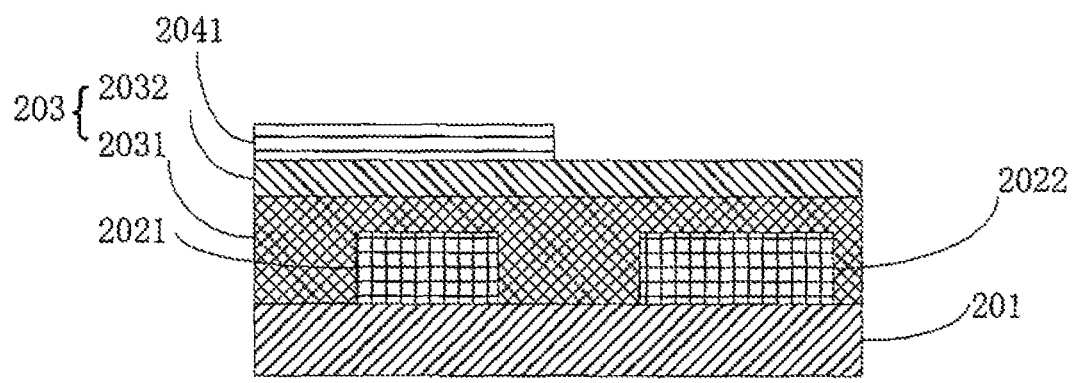

In the step S104, as shown in FIG. 2E, a metal-oxide-semiconductor layer 204 is deposited on the first insulation layer 203. The metal-oxide-semiconductor layer 204 can be formed by using a sputtering process. The metal-oxide-semiconductor layer 204 has a thickness ranging from 50 to 2000 angstroms. Preferably, the metal-oxide-semiconductor layer 204 is made of amorphous indium-gallium-zinc oxide. Then, as shown in FIG. 2F, the metal-oxide-semiconductor layer is patterned to form an electrically conductive channel 2041.

Figure 2G:
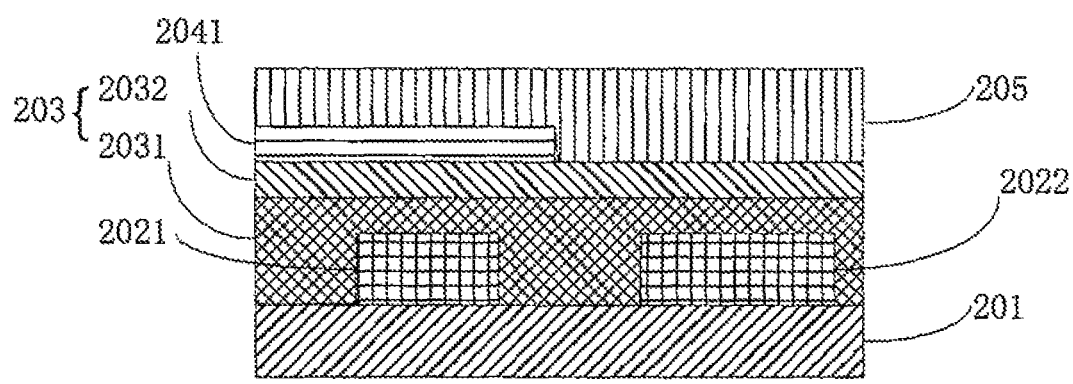
Figure 2H:
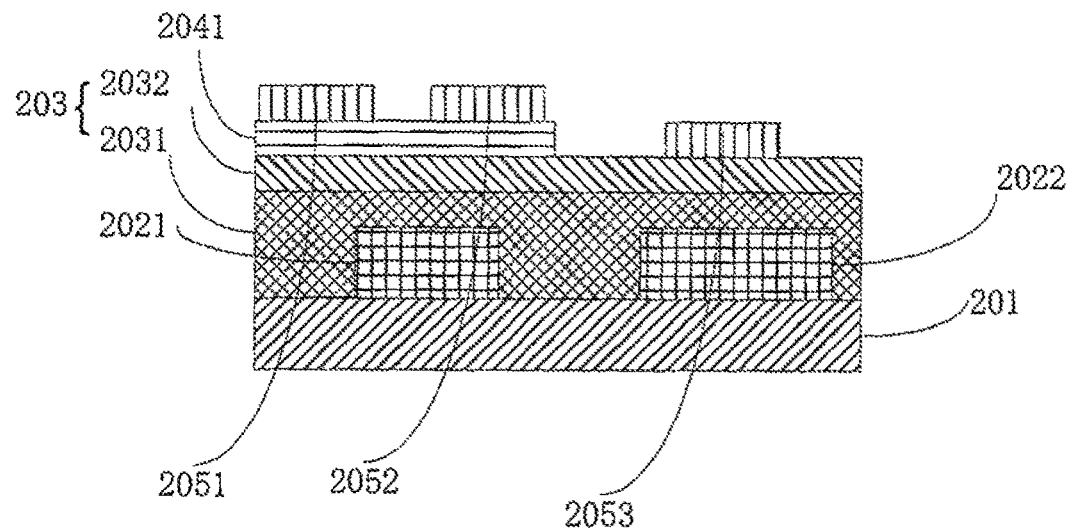

In the step S105, as shown in FIG. 2G, a second graphene layer 205 is deposited on the electrically conductive channel 204. Specifically, a second graphene layer 205 is formed on the electrically conductive channel 204 by using a chemical vapor deposition process or a spin coating process. Then, as shown in FIG. 2H, the second graphene layer 205 is patterned to form a pattern which includes a source electrode 2051, a drain electrode 2052, and a data line 2053. The electrically conductive channel 2041 is connected to the source electrode 2051 and the drain electrode 2052.

Figure 2I:
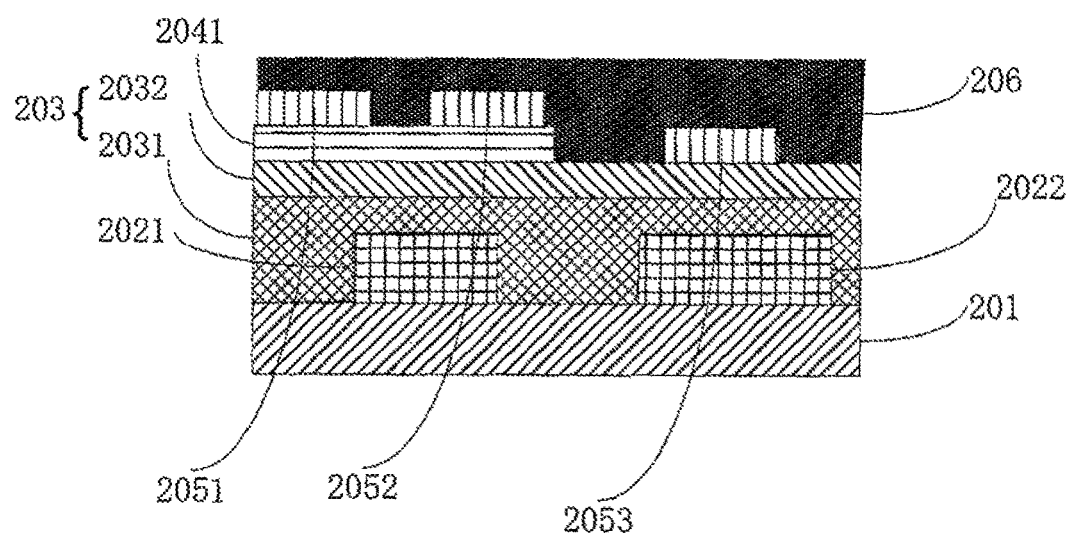

In the step S106, as shown in FIG. 2I, a second insulation layer 206 is formed on the second graphene layer 205. The second insulation layer 206 is made of an organic resin, and the second insulation layer 206 has a thickness ranging from 4000 to 30000 angstroms.

In the step S107, a carbon nanotube layer 207 is deposited on the second insulation layer 206. Additionally, the carbon nanotube layer 207 is patterned to form a pixel electrode 2071. The pixel electrode 2071 is electrically connected to the drain electrode 2052 via a through-hole 2072.

Figure 2J:
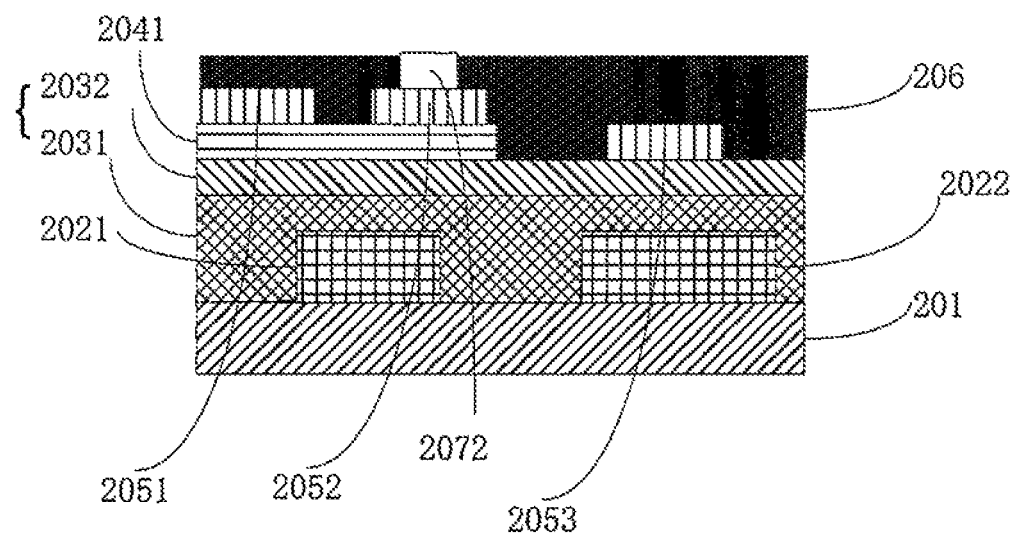
Figure 2K:
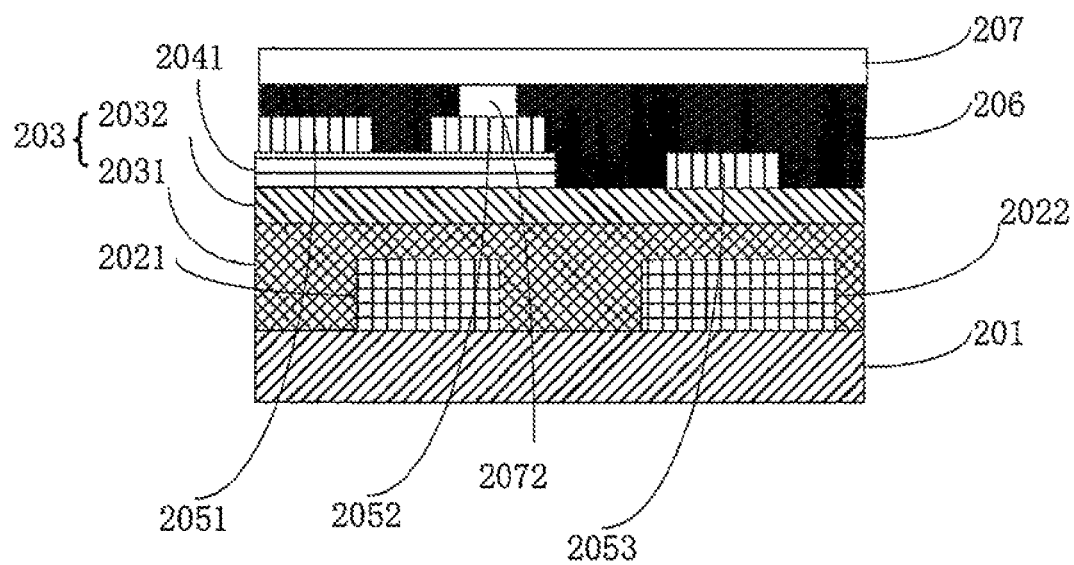
Figure 2L:
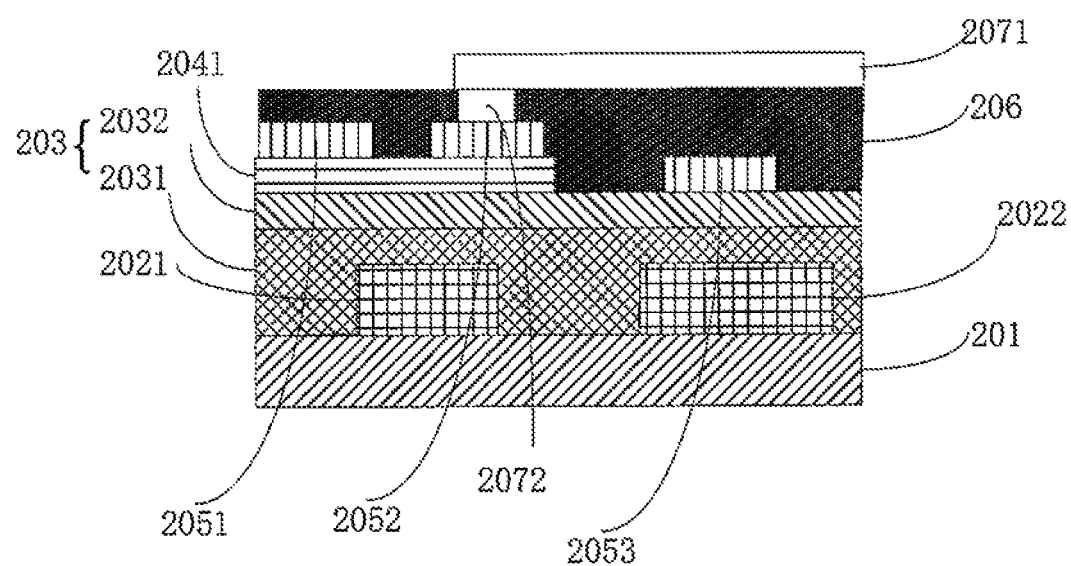

Specifically, as shown in FIG. 2J, a through-hole 2072 is formed in the second insulation layer 206. Next, as shown in FIG. 2K, a carbon nanotube layer 207 is deposited on the second insulation layer 206. Then, as shown in FIG. 2L, the carbon nanotube layer 207 is patterned to form a pixel electrode 2071, wherein the pixel electrode 2071 is electrically connected to the drain electrode 2052 via a through-hole 2072.

In this way, a flexible array substrate is obtained.

In the method for manufacturing a flexible array substrate of this preferred embodiment, graphene is utilized to form the gate electrode, the scan line, the source electrode, the drain electrode, and the data line, which not only reduces image signal delay but enhances display quality. In addition, a metal-oxide-semiconductor material is further utilized to form the electrically conducive channel, enabling the array substrate to have excellent light transparency and flexibility.

The present disclosure further provides a flexible array substrate. The flexible array substrate is manufactured by the method for manufacturing a flexible array substrate according to the above-said preferred embodiment. Please refer to the method for manufacturing a flexible array substrate according to the above-said preferred embodiment to realize detailed structure of the manufactured flexible array substrate, and a structure of the flexible array substrate is omitted.

The present disclosure provides a flexible array substrate and a method for manufacturing same. According to the present disclosure, graphene is utilized to form the gate electrode, the scan line, the source electrode, the drain electrode, and the data line, which not only reduces image signal delay but enhances display quality. In addition, a metal-oxide-semiconductor material is further utilized to form the electrically conducive channel, enabling the array substrate to have excellent light transparency and flexibility.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a flexible array substrate, comprising:
    providing a substrate;
    forming a first graphene layer on the substrate, and patterning the first graphene layer to form a gate electrode and a scan line;
    forming a first insulation layer on the substrate, the gate electrode, and the scan line;
    forming a metal-oxide-semiconductor layer on the first insulation layer, and patterning the metal-oxide-semiconductor layer to form an electrically conductive channel, wherein the metal-oxide-semiconductor layer is made of amorphous indium-gallium-zinc oxide;
    forming a second graphene layer on the electrically conductive channel and the first insulation layer, and patterning the second graphene layer to form a source electrode, a drain electrode, and a data line, wherein the electrically conductive channel is connected to the source electrode and the drain electrode;
    forming a second insulation layer on the substrate, the source electrode, the drain electrode, and the data line; and
    forming a carbon nanotube layer on the second insulation layer, and patterning the carbon nanotube layer to form a pixel electrode; wherein the pixel electrode is electrically connected to the drain electrode via a through-hole;
    wherein the substrate is a transparent glass substrate or a plastic substrate; and
    wherein the first insulation layer includes a third insulation layer and a fourth insulation layer, the fourth insulation layer is disposed on the third insulation layer; and the third insulation layer is made of an organic resin, and the fourth insulation layer is made of oxide, nitride, or oxynitride.

2. The method for manufacturing the flexible array substrate according to claim 1, wherein the metal-oxide-semiconductor layer has a thickness ranging from 50 to 2000 angstroms.

3. The method for manufacturing the flexible array substrate according to claim 1, wherein the second insulation layer is made of an organic resin.

4. The method for manufacturing the flexibly array substrate according to claim 3, wherein the second insulation layer has a thickness ranging from 4000 to 30000 angstroms.

5. The method for manufacturing the flexible array substrate according to claim 1, wherein the first graphene layer and the second graphene layer are formed by using a chemical vapor deposition process or a spin coating process.

6. A method for manufacturing a flexible array substrate, comprising:
    providing a substrate;
    forming a first graphene layer on the substrate, and patterning the first graphene layer to form a gate electrode and a scan line;
    forming a first insulation layer on the substrate, the gate electrode, and the scan line;
    forming a metal-oxide-semiconductor layer on the first insulation layer, and patterning the metal-oxide-semiconductor layer to form an electrically conductive channel, wherein the metal-oxide-semiconductor layer is made of amorphous indium-gallium-zinc oxide;
    forming a second graphene layer on the electrically conductive channel and the first insulation layer, and patterning the second graphene layer to form a source electrode, a drain electrode, and a data line, wherein the electrically conductive channel is connected to the source electrode and the drain electrode;
    forming a second insulation layer on the substrate, the source electrode, the drain electrode, and the data line; and
    forming a carbon nanotube layer on the second insulation layer, and patterning the carbon nanotube layer to form a pixel electrode, wherein the pixel electrode is electrically connected to the drain electrode via a through-hole.

7. The method for manufacturing the flexible array substrate according to claim 6, wherein the substrate is a transparent glass substrate or a plastic substrate.

8. The method for manufacturing the flexible array substrate according to claim 6, wherein the first insulation layer includes a third insulation layer and a fourth insulation layer, the fourth insulation layer is disposed on the third insulation layer; and the third insulation layer is made of an organic resin, and the fourth insulation layer is made of oxide, nitride, or oxynitride.

9. The method for manufacturing the flexible array substrate according to claim 8, wherein the metal-oxide-semiconductor layer has a thickness ranging from 50 to 2000 angstroms.

10. The method for manufacturing the flexible array substrate according to claim 6, wherein the second insulation layer is made of an organic resin.

11. The method for manufacturing the flexible array substrate according to claim 10, wherein the second insulation layer has a thickness ranging from 4000 to 30000 angstroms.

12. The method for manufacturing the flexible array substrate according to claim 6, wherein the first graphene layer and the second graphene layer are formed by using a chemical vapor deposition process or a spin coating process.

13. A flexible array substrate, comprising:
a substrate;
a gate electrode and a scan line disposed on the substrate;
a first insulation layer disposed on the gate electrode and the scan line;
an electrically conductive channel disposed on the first insulation layer;
a source electrode and a drain electrode disposed on the electrically conductive channel, and a data line disposed on the first insulation layer;
a second insulation layer disposed on the source electrode, the drain electrode, and the data line; and
a pixel electrode disposed on the second insulation layer;
wherein the electrically conductive channel is connected to the source electrode and the drain electrode, and the pixel electrode is electrically connected to the drain electrode via a through-hole;
wherein the gate line and the scan line are formed from a patterned first graphene layer; the electrically conductive channel is formed from a patterned metal-oxide-semiconductor layer, and the patterned metal-oxide-semiconductor layer is made of amorphous indium-gallium-zinc oxide; the source electrode, the drain electrode, and the data line are formed from a patterned second graphene layer; and the pixel electrode is formed from a patterned carbon nanotube layer.

14. The flexible array substrate according to claim 13, wherein the substrate is a transparent glass substrate or a plastic substrate.

15. The flexible array substrate according to claim 13, wherein the first insulation layer includes a third insulation layer and a fourth insulation layer disposed on the third insulation layer, and the third insulation layer is made of an organic resin, and the fourth insulation layer is made of oxide, nitride, or oxynitride.

16. The flexible array substrate according to claim 15, wherein the metal-oxide-semiconductor layer has a thickness ranging from 50 to 2000 angstroms.

17. The flexible array substrate according to claim 13, wherein the second insulation layer is made of an organic resin.

18. The flexible array substrate according to claim 17, wherein the second insulation layer has a thickness ranging from 4000 to 30000 angstroms.

* * * * *